United States Patent [19]

Hemler et al.

[11] Patent Number: 4,640,499
[45] Date of Patent: Feb. 3, 1987

[54] HERMETIC CHIP CARRIER COMPLIANT SOLDERING PADS

[75] Inventors: Paul F. Hemler, Arnold, Md.; William A. Rohr, Buffalo, N.Y.

[73] Assignee: The United States of America as represented by the Secretary of the Air Force, Washington, D.C.

[21] Appl. No.: 729,389

[22] Filed: May 1, 1985

[51] Int. Cl.⁴ .............................................. F16F 1/00
[52] U.S. Cl. .................................... 267/160; 267/165; 361/404; 361/408
[58] Field of Search ....................... 361/404, 406, 408; 338/316; 267/158, 160, 165, 181; 188/73.38

[56] References Cited

U.S. PATENT DOCUMENTS

| 3,374,400 | 3/1968 | Tabuchi et al. | 361/406 |
| 3,588,618 | 6/1971 | Otte | 361/404 |
| 3,589,000 | 6/1971 | Galli | 29/590 |
| 4,113,298 | 9/1978 | Kopp | 267/158 X |
| 4,363,076 | 12/1982 | McIver | 361/408 X |

FOREIGN PATENT DOCUMENTS 3018370 11/1981 Fed. Rep. of Germany ... 188/73.38

Primary Examiner—Arthur T. Grimley
Assistant Examiner—Morris H. Nimmo
Attorney, Agent, or Firm—Donald J. Singer; Stanton E. Collier

[57] ABSTRACT

Compliant soldering pads allow for expansion and contraction between an hermetic chip carriers (HCC) and printed wiring boards (PWB) due to coefficient of thermal expansion mismatch and prevent solder cracking which in turn causes electrical discontinuities. The pads allow for flexing in three axes.

4 Claims, 8 Drawing Figures

HERMETIC CHIP CARRIER COMPLIANT SOLDERING PADS

STATEMENT OF GOVERNMENT INTEREST

The invention described herein may be manufactured and used by or for the Government for governmental purposes without the payment of any royalty thereon.

BACKGROUND OF THE INVENTION

This invention relates generally to electronic devices, and, particularly, relates to means for mounting chip carriers to printed wiring boards.

In the past, integrated circuit chips have been prepared wherein such a chip usually includes a plurality of active elements such as transistors, resistors, capacitors and the like, intercoupled in an integral manner on a single silicon chip. Each chip is packaged individually in containers such as cans or flat-packs or carriers, or mounted directly to hybrid packages. Individual leads are connected to the packaged chip carrier for connection to exterior circuitry.

Hermetic chip carriers, hereinafter referred to as carriers, come in package sizes having twenty eight solder pads or more thereon for connecting to external circuitry which can be on, for example, printed wiring boards.

In the past, after these carriers have been soldered onto the boards, the solder joints thereformed when subjected to temperature cycling from −55° C. to about 125° C. have experienced cracking, and as a result therefrom, electrical discontinuities occurred.

Solder cracking is caused by coefficient of thermal expansion differences between the carrier and the board. This mismatch between the carrier and the board causes a different growth of both. Problems still prevail even if the board material is the same as the carrier. The board is limited in size because of the brittleness of the alumina used thereon. Secondly, there is normally a power-on condition on the carrier. This power-on condition causes a thermal gradient across the solder joints from the carrier to the board. Some joints will expand more than others resulting in localized stresses and thus cracking.

One method used in the past to solve this problem was an elastic, electrically conductive joint, but this has resulted in the carrier becoming thermally isolated and thus overheating.

The present invention is directed toward providing a means of mounting the carrier to the board in which these undesirable characteristics are minimized.

SUMMARY OF THE INVENTION

The present invention sets forth compliant soldering pads that overcome the problems set forth hereinabove.

One embodiment of the compliant soldering pad of the present invention is as noted above connected between a hermetic chip carrier and a printed wiring board. There being one such pad between the carrier and the board for each electrical contact on the carrier.

The first embodiment of the compliant soldering pad is shaped like a right-angled triangle as seen from the side. The hypotenuse leg is separated into a lower diagonal leg and an upper diagonal leg. The lower diagonal leg is integrally attached to a vertical support and the upper diagonal leg has attached thereon a horizontal support. Neither support being in contact with the other. The pad can be formed from a single strip of metal having a width several times less than either the length or the height of the pad. Each diagonal leg noted above has metal removed from each side to form a more flexible leg.

Each pad can be soldered in a castellated manner to provide added horizontal support.

The second embodiment of the pad is shaped like a "Z". The diagonal leg has metal removed to form a more flexible leg. A vertical support being the top of the "Z" is soldered to the carrier. The horizontal leg of the "Z" is soldered to the board.

It is therefore an object of the present invention to provide a more flexible means of attaching a hermetic chip carrier to a printed wiring board; and Another object of the present invention is to provide a compliant soldering pads that allow temperature expansion and contraction without causing solder cracking.

These and many other objects and advantages of the present invention will be readily apparent to one skilled in the pertinent art from the following detailed description of a preferred embodiment of the invention and the related drawings.

DETAILED DESCRIPTION OF THE PREFERRED EMBODIMENT

Figure 1:
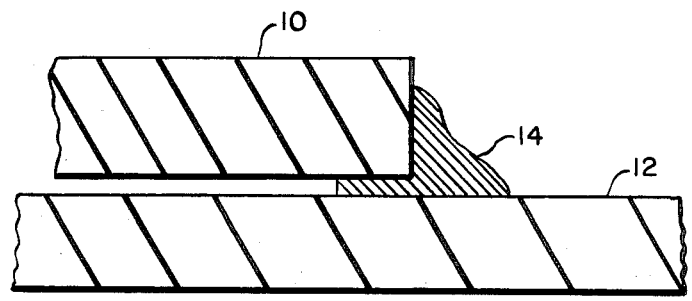
FIG. 1 illustrates the prior method of attaching a hermetic chip carrier to a printed wiring board with solder.

Referring to FIG. 1 a hermetic chip carrier 10 is shown soldered to a printed wiring board 12. It should be understood that there is one such castellated solder joint 14 for each electrical contact, not shown, on carrier 10. In fact carrier 10 may have 28 or more electrical connections. Also, joints 14 provide the necessary vertical and horizontal support for carrier 10 once it is attached to board 12. Board 12 is a typical printed wiring board having electrical paths, not shown, thereon to the electronic devices, not shown. As is noted above, temperature changes have resulted in the cracking of solder joints 14 because of localized stresses created by temperature differentials within joint 14 itself.

Figure 2:
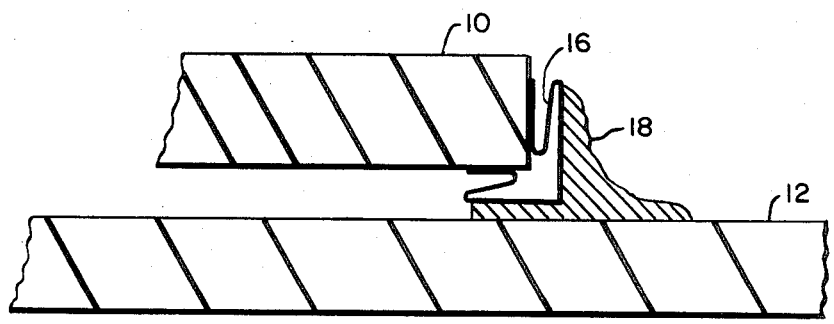
FIG. 2 illustrates a triangular shaped compliant soldering pad of the present invention.

Referring to FIG. 2, a compliant soldering pad 16 is shown connected between carrier 10 and board 12 with a castellated solder joint 18. Pad 16 is soldered to both joint 18 and to carrier 10.

Typically, pads 16 are pretinned and are placed in a jig, not shown, that positions each pad 16 in the correct manner. Carrier 10 is then placed thereon or other device and is heated so that pads 16 are soldered to carrier 10. The whole assembly, carrier 10 and pads 16 thereon, is placed onto board 12 where solder joints 18 are made between pads 16 and board 12.

Figure 3A:
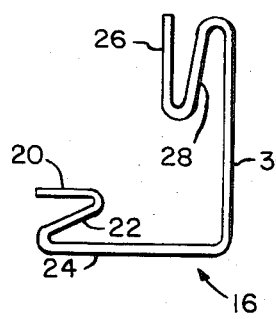
FIGS. 3A to 3C illustrate by different views the pad illustrated in FIG. 2.

Referring to FIG. 3A, pad 16 is shown in a side view. Pads 16 may be made of copper or other metal suitable for soldering and sufficiently flexible and strong.

Pad 16 is right-angled triangular shaped. Pad 16 has a vertical support 20 with a lower diagonal leg 22 attached thereon. Horizontal leg 24 is attached to lower diagonal leg 22 and a vertical leg 30. A horizontal support 26 has an upper diagonal leg 28 attached thereon and leg 28 is also attached to vertical leg 30. Pad 16 is made from one piece of metal and bent to conform to the shape shown or one of equivalent shape.

Figure 3B:
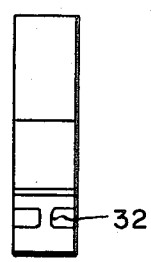
Figure 3C:

To provide additional flexibility, both diagonal legs 22 and 28 can have metal removed from sides to form smaller diagonal legs 32 and 34 as shown in FIGS. 3B and 3C. FIG. 3B is a front view of pad 16 shown in FIGS. 3A and 3C is the vertical views. The width of pad 16 is a typically a fraction of the overall length or height as shown in FIG. 3A. It should also be understood that horizontal leg 24 or vertical leg 30 need not be of the same width or for that matter the same width as support 20 and 26.

As stated above pads 16 can be pretinned and held in a jig while carrier 10 is attached by oven heating.

Figure 4:
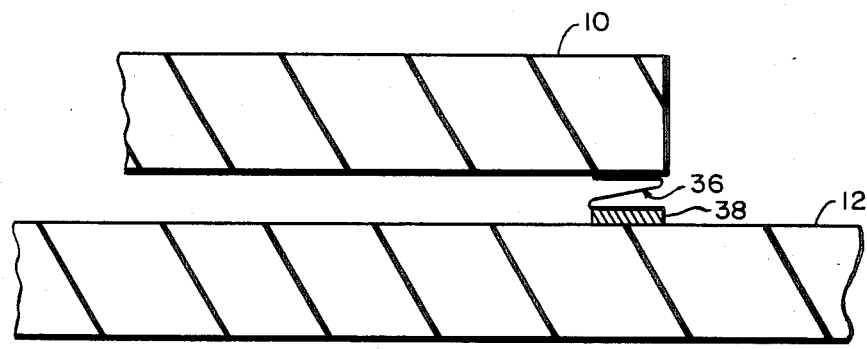
FIG. 4 illustrates a "Z" shaped compliant soldering pad of the present invention.

A second embodiment is shown in FIG. 4. Pad 36 functions in the same manner as pad 16. As shown pad 36 is "Z" shaped and attaches to an electrical contact on the bottom of carrier 10.

Figure 5A:
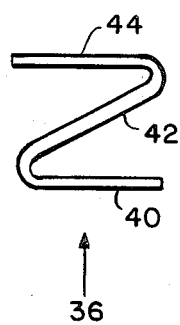
FIGS. 5A and 5B illustrate by different views the pad of FIG. 4.
Figure 5B:
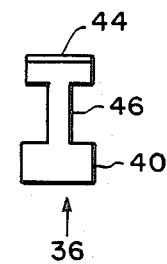

FIG. 5A shows pad 36 having a horizontal leg 40, a diagonal leg 42, and a vertical support 44. Diagonal leg 42 can have metal removed from both sides to form a smaller diagonal leg 46 as shown in FIG. 5B which provides for greater flexibility. The same features are applicable to pad 36 as noted as to pad 16.

Each compliant soldering pad 16 or 36 allows for expansion and contraction in all three axial directions. Each pad 16 or 36 can individually move and as a result solder cracking and electrical discontinuities are eliminated because of temperature differentials between carrier 10 and board 12.

Clearly, many modifications and variations of the present invention are possible in light of the above teachings and it is therefore understood, that within the inventive scope of the inventive concept, the invention may be practiced otherwise than specifically claimed.

What is claimed is:

1. A compliant soldering pad for attaching an electronic device to electrical paths, said compliant soldering pad comprising:
    a horizontal leg, said horizontal leg being for soldering to electrical paths,
    a vertical leg, said vertial leg being integrally attached to said horizontal leg at an angle of about 90 degrees,
    a lower diagonal leg, said lower diagonal leg being attached to said horizontal leg,
    an upper diagonal leg, said upper diagonal leg being attached to said vertical leg, said diagonal legs being near the hypotenuse between said horizontal leg and said vertical leg,
    a vertical support, said vertical support being attached to said lower diagonal leg, said vertical support being for soldering to a bottom of an electronic device, and
    a horizontal support, said horizontal support being attached to said upper diagonal leg, said horizontal support being for soldering to a vertical side of an electronic device.

2. A compliant soldering pad as defined in claim 1 wherein said lower and said upper diagonal legs have material removed therefrom to form a smaller width than said horizontal and said vertical legs.

3. A compliant soldering pad as defined in claim 1 wherein said lower diagonal leg has material removed therefrom to form a smaller width than said horizontal leg.

4. A compliant soldering pad as defined in claim 1 wherein said upper diagonal leg has material removed therefrom to form a smaller width than said vertical leg.

* * * * *